(12) United States Patent
Kyung et al.

(10) Patent No.: US 7,600,174 B2
(45) Date of Patent: Oct. 6, 2009

(54) APPARATUS AND METHOD FOR ENCODING AND DECODING A BLOCK LOW DENSITY PARITY CHECK CODE

(75) Inventors: Gyu-Bum Kyung, Suwon-si (KR); Hong-Sil Jeong, Suwon-si (KR); Dong-Seek Park, Yongin-si (KR); Jae-Yoel Kim, Gunpo-si (KR)

(73) Assignee: Samsung Electronics Co., Ltd (KR)

( * ) Notice: Subject to any disclaimer, the term of this patent is extended or adjusted under 35 U.S.C. 154(b) by 584 days.

(21) Appl. No.: 11/201,663

(22) Filed: Aug. 10, 2005

(65) Prior Publication Data
US 2006/0036927 A1 Feb. 16, 2006

(30) Foreign Application Priority Data
Aug. 10, 2004 (KR) .................. 10-2004-0062977

(51) Int. Cl.
*H03M 13/00* (2006.01)
(52) U.S. Cl. ..................... 714/758; 714/781
(58) Field of Classification Search .......... 714/758, 714/781

See application file for complete search history.

(56) References Cited

U.S. PATENT DOCUMENTS

| | | | | |
|---|---|---|---|---|
| 6,785,863 | B2* | 8/2004 | Blankenship et al. | 714/799 |
| 7,162,684 | B2* | 1/2007 | Hocevar | 714/800 |
| 7,178,085 | B2* | 2/2007 | Chae et al. | 714/758 |
| 7,260,763 | B2* | 8/2007 | Sukhobok et al. | 714/758 |
| 2003/0014718 | A1 | 1/2003 | De Souza et al. | |
| 2003/0037298 | A1 | 2/2003 | Eleftheriou et al. | |
| 2004/0148560 | A1 | 7/2004 | Hocevar | |

FOREIGN PATENT DOCUMENTS

| | | |
|---|---|---|
| EP | 1 379 001 | 1/2004 |
| EP | 1 387 496 | 2/2004 |
| EP | 1 443 656 | 8/2004 |
| EP | 1 511 177 | 3/2005 |
| EP | 1 592 137 | 11/2005 |
| JP | 2004-064756 | 2/2004 |
| JP | 2004-147318 | 5/2004 |
| JP | 2004-236313 | 8/2004 |
| RU | 2 235 424 | 6/2003 |
| SU | 1505451 | 8/1989 |
| WO | WO 02/095965 | 11/2002 |
| WO | WO 2004/047307 | 6/2004 |

OTHER PUBLICATIONS

F. Guo et al., "LDPC Assisted Block Coded Modulation for Transmission Over Rayleigh Fading Channels", Vehicular Technology Conference, Apr. 22-25, 2003.

Yeo et al., "High Throughput Low-Density Parity-Check Decoder Architectures", IEEE Global Telecommunications Conference, Nov. 25, 2001.

(Continued)

*Primary Examiner*—Joseph D Torres
(74) *Attorney, Agent, or Firm*—The Farrell Law Firm, LLP

(57) ABSTRACT

Apparatus and method for coding a block low density parity check (LDPC) code. Upon receiving an information word vector, an encoder codes the information word vector into a block LDPC code according to a predetermined generation matrix. A modulator modulates the block LDPC code into a modulation symbol using a predetermined modulation scheme. A transmitter transmits the modulation symbol.

5 Claims, 15 Drawing Sheets

OTHER PUBLICATIONS

Richardson et al., "Efficient Encoding of Low-Density Parity-Check Codes", IEEE Transactions on Information Theory, Feb. 2001.

Zhang et al., "A Class of Efficient-Encoding Generalized Low-Density Parity-Check Codes", IEEE International Conference on Acoustics, Speech, and Signal Processing, May 7, 2001.

Dong-U Lee et al., A Flexible Hardware Encoder Encoder for Low Density Parity-Check Codes, 2004.

Su-Chang Chae et al., Low Complexity Encoding of Regular Low Density Parity Check Codes, 2003.

* cited by examiner

| $P^a{}_{11}$ | $P^a{}_{12}$ | $P^a{}_{13}$ | $P^a{}_{14}$ | ... | $P^a{}_{1(q-1)}$ | $P^a{}_{1q}$ |
|---|---|---|---|---|---|---|
| $P^a{}_{21}$ | $P^a{}_{22}$ | $P^a{}_{23}$ | $P^a{}_{24}$ | ... | $P^a{}_{2(q-1)}$ | $P^a{}_{2q}$ |
| $P^a{}_{31}$ | $P^a{}_{32}$ | $P^a{}_{33}$ | $P^a{}_{34}$ | ... | $P^a{}_{3(q-1)}$ | $P^a{}_{3q}$ |
| ⋮ | ⋮ | ⋮ | ⋮ | ... | ⋮ | ⋮ |
| $P^a{}_{p1}$ | $P^a{}_{p2}$ | $P^a{}_{p3}$ | $P^a{}_{p4}$ | ... | $P^a{}_{p(q-1)}$ | $P^a{}_{pq}$ |

FIG.4
(PRIOR ART)

$$P = \begin{bmatrix} 0 & 1 & 0 & & 0 \\ 0 & 0 & 1 & \cdots & 0 \\ \vdots & \vdots & \vdots & & \vdots \\ 0 & 0 & 0 & \cdots & 1 \\ 1 & 0 & 0 & & 0 \end{bmatrix}$$

$$B^T = \begin{bmatrix} P^{a_1} & 0 & \cdots & P^y & \cdots & 0 & 0 \end{bmatrix}$$

$$T = \begin{bmatrix} 1 & P^{a_2} & 0 & \cdots & 0 & 0 & 0 \\ P^{a_2} & 1 & 0 & \cdots & 0 & 0 & 0 \\ 0 & P^{a_3} & 1 & \cdots & 0 & 0 & 0 \\ 0 & 0 & 0 & \cdots & 0 & 0 & 0 \\ \vdots & \vdots & \vdots & \cdots & \vdots & \vdots & \vdots \\ 0 & 0 & 0 & \cdots & 0 & 0 & 0 \\ 0 & 0 & 0 & \cdots & P^{a_{m-2}} & 1 & 0 \\ 0 & 0 & 0 & \cdots & 0 & P^{a_{m-1}} & 1 \end{bmatrix}$$

$$E = \begin{bmatrix} 0 \\ 0 \\ 0 \\ \vdots \\ 0 \\ 0 \\ 0 \\ P^{a_m} \end{bmatrix}$$

$$T^{-1} = \begin{bmatrix} 1 & 0 & 0 & \cdots & 0 & 0 & 0 \\ P^{a_2} & 1 & 0 & \cdots & 0 & 0 & 0 \\ P^{2 \sim 3} & P^{a_3} & 1 & \cdots & 0 & 0 & 0 \\ \vdots & \vdots & \vdots & \cdots & \vdots & \vdots & \vdots \\ P^{2 \sim (m-2)} & P^{3 \sim (m-2)} & P^{4 \sim (m-2)} & \cdots & P^{a_{m-2}} & 0 & 0 \\ P^{2 \sim (m-1)} & P^{3 \sim (m-1)} & P^{4 \sim (m-1)} & \cdots & P^{(m-2)(m-1)} & P^{a_{m-1}} & 0 \\ \end{bmatrix}$$

| 1 | 0 | 0 | 0 | ... | 0 | 0 | 0 |
|---|---|---|---|---|---|---|---|
| 1 | 1 | 0 | 0 | ... | 0 | 0 | 0 |
| 0 | 1 | 1 | 0 | ... | 0 | 0 | 0 |

...

| 0 | 0 | 0 | ... | 0 | 1 | 1 | 0 |
|---|---|---|---|---|---|---|---|
| 0 | 0 | 0 | ... | 0 | 0 | 1 | 1 |

$$F = \begin{bmatrix} 1 & 0 & 0 & 0 & \cdots & 0 & 0 \\ 0 & 1 & 0 & 0 & \cdots & 0 & 0 \\ 0 & 0 & 1 & 0 & \cdots & 0 & 0 \\ & & & \cdots & & & \\ 0 & 0 & 0 & \cdots & 0 & 1 & 0 \\ 0 & 0 & 0 & \cdots & 0 & 0 & P^{-a_m} \end{bmatrix}$$

FIG.12

APPARATUS AND METHOD FOR ENCODING AND DECODING A BLOCK LOW DENSITY PARITY CHECK CODE

PRIORITY

This application claims priority under 35 U.S.C. § 119(a) to an application entitled "Apparatus and Method for Encoding/Decoding Block Low Density Parity Check Code" filed in the Korean Intellectual Property Office on Aug. 10, 2004 and assigned Serial No. 2004-62977, the contents of which are incorporated herein by reference.

BACKGROUND OF THE INVENTION

1. Field of the Invention

The present invention relates to an apparatus and method for encoding and decoding block Low Density Parity Check (LDPC) codes.

2. Description of the Related Art

In communications, the most essential issue is to efficiently and reliably transmit data over a channel. The next generation multimedia mobile communication system, which is currently being researched, requires a high-speed communication system capable of processing and transmitting various information, such as image and radio data, beyond the early voice-oriented service. Therefore, it is essential to increase system efficiency by using a channel coding scheme appropriate for the system.

Transmission data inevitably suffers errors due to noise, interference, and fading according to channel conditions, thereby causing a loss of a great amount of information. In order to reduce the loss of the information, various error control schemes are currently in use that are based in part on channel characteristics to thereby improve the reliability of the mobile communication system. The most basic error control scheme uses error correction codes.

FIG. 1 is a diagram illustrating a transceiver in a conventional mobile communication system. Referring to FIG. 1, in a transmitter, a transmission message 'u' is encoded by an encoder 101 with a predetermined encoding scheme, before being transmitted through a channel. A coded symbol 'c' encoded by the encoder 101 is modulated by a modulator 103 using a predetermined modulation scheme, and the modulated signal 's' is transmitted to a receiver via a channel 105.

In the receiver, a received signal 'r' is a distorted signal in which the signal 's' transmitted by the transmitter is mixed with several noises according to channel conditions. The received signal 'r' is demodulated by a demodulator 107 with a demodulation scheme corresponding to the modulation scheme used in the modulator 103 of the transmitter, and the demodulated signal 'x' is decoded by a decoder 109 with a decoding scheme corresponding to the encoding scheme used in the encoder 101 of the transmitter. The signal decoded by the decoder 109 is denoted by û.

Accordingly, there is a need for high-performance channel encoder and decoder to enables the receiver to restore the signal 'u' transmitted by the transmitter without error. In particular, when the channel 105 is a wireless channel, errors caused by the channel should be considered more seriously. The decoder 109 of the receiver can estimate the transmission message based on the data received through the channel 105.

With the rapid progress of the mobile communication system, there is a demand for technology capable of enabling a wireless network to transmit data having the high capacity approximating that of a wireless network. As there is a demand for a high-speed, high-capacity communication system capable of processing and transmitting multimedia data such as image and radio data beyond the voice-oriented service, it is essential to increase system transmission efficiency with use of an appropriate channel coding scheme, for improving system performance. However, a mobile communication system inevitably suffers from errors, which commonly occur due to noise, interference, and fading according to channel conditions during data transmission. As described above, the occurrence of errors causes a loss of information data.

In order to reduce the information data loss due to the error occurrence, it is possible to improve reliability of the mobile communication system by using various error-control techniques. A technique using error correction codes is the most popularly used error-control technique. A description will now be made of turbo codes and low density parity check (LDPC) codes, which are the typical error correction codes.

It is well known that the turbo code is superior in performance gain to a convolutional code conventionally used for error correction, during high-speed data transmission. The turbo code is advantageous in that it can efficiently correct an error caused by noises generated in a transmission channel, thereby increasing reliability of the data transmission.

The LDPC code can be decoded using an iterative decoding algorithm base on a sum-product algorithm in a factor graph. Because a decoder for the LDPC code uses the sum-product algorithm-based iterative decoding algorithm, it is lower in complexity to a decoder for the turbo code. In addition, the decoder for the LDPC code is easy to implement with a parallel processing decoder, compared with the decoder for the turbo code.

Shannon's channel coding theorem shows that reliable communication is possible only at a data rate not exceeding a channel capacity. However, Shannon's channel coding theorem has proposed no detailed channel encoding and decoding method for supporting a data rate up to the channel capacity limit. Although a random code having a very large block size shows performance approximating the channel capacity limit of Shannon's channel coding theorem, it is actually impossible to implement a MAP (Maximum A Posteriori) or ML (Maximum Likelihood) decoding method because of its heavy calculation load.

The turbo code was proposed by Berrou, Glavieux, and Thitimajshima in 1993, and has superior performance approximating the channel capacity limit of Shannon's channel coding theorem. The proposal of the turbo code triggered off active research on iterative decoding and graphical expression of codes, and LDPC codes proposed by Gallager in 1962 are newly spotlighted in the research. Cycles exist in a factor graph of the turbo code and the LDPC code, and it is well known that iterative decoding in the factor graph of the LDPC code where cycles exist is suboptimal. Also, it has been experimentally proved that the LDPC code has excellent performance through iterative decoding. The LDPC code known to have the highest performance ever shows performance having a difference of only about 0.04 [dB] at the channel capacity limit of Shannon's channel coding theorem at a bit error rate (BER) $10^{-5}$, using a block size $10^7$. In addition, although an LDPC code defined in Galois field (GF) with $q>2$, i.e., GF(q), increases in complexity in its decoding process, it is much superior in performance to a binary code. However, there has been provided no satisfactory theoretical description of successful decoding by an iterative decoding algorithm for the LDPC code defined in GF(q).

The LDPC code, proposed by Gallager, is defined by a parity check matrix in which major elements have a value of 0 and minor elements, i.e., the elements not having the value of 0, have a value of 1. For example, an (N, j, k) LDPC code is a linear block code having a block length N, and is defined by a sparse parity check matrix in which each column has j elements having a value of 1, each row has k elements having a value of 1, and all of the elements except for the elements having the value of 1 all have a value of 0.

An LDPC code in which a weight of each column in the parity check matrix is fixed to 'j' and a weight of each row in the parity check matrix is fixed to 'k' as stated above, is called a "regular LDPC code." Herein, "weight" refers to the number of elements having a non-zero value among the elements included in the generating matrix and parity check matrix. Unlike the regular LDPC code, an LDPC code in which the weight of each column in the parity check matrix and the weight of each row in the parity check matrix are not fixed is called an "irregular LDPC code." It is generally known that the irregular LDPC code is superior in performance to the regular LDPC code. However, in the case of the irregular LDPC code, because the weight of each column and the weight of each row in the parity check matrix are not fixed, i.e., are irregular, the weight of each column in the parity check matrix and the weight of each row in the parity check matrix must be properly adjusted in order to guarantee the excellent performance.

FIG. 2 is a diagram illustrating a parity check matrix of a general (8, 2, 4) LDPC code. Referring to FIG. 2, a parity check matrix H of the (8, 2, 4) LDPC code has 8 columns and 4 rows, wherein a weight of each column is fixed to 2 and a weight of each row is fixed to 4. Because the weight of each column and the weight of each row in the parity check matrix are regular, the (8, 2, 4) LDPC code illustrated in FIG. 2 becomes a regular LDPC code.

FIG. 3 is a diagram illustrating a factor graph of the (8, 2, 4) LDPC code of FIG. 2. Referring to FIG. 3, a factor graph of the (8, 2, 4) LDPC code includes 8 variable nodes of $x_1$ 300, $x_2$ 302, $x_3$ 304, $x_4$ 306, $x_5$ 308, $x_6$ 310, $x_7$ 312, and $x_8$ 314, and 4 check nodes 316, 318, 320, and 322. When an element having a value of 1, i.e., a non-zero value, exists at a point where an $i^{th}$ row and a $j^{th}$ column of the parity check matrix of the (8, 2, 4) LDPC code cross each other, a branch is created between a variable node $x_i$ and a $j^{th}$ check node.

Because the parity check matrix of the LDPC code has a very small weight, it is possible to perform decoding through iterative decoding even in a block code having a relatively large size that exhibits performance approximating a channel capacity limit of Shannon's channel coding theorem, such as a turbo code, while continuously increasing a block size of the block code. MacKay and Neal have proven that an iterative decoding process of an LDPC code using a flow transfer scheme approximates an iterative decoding process of a turbo code in performance.

In order to generate a high-performance LDPC code, the following conditions should be satisfied.

(1) Cycles in a Factor Graph of an LDPC Code Should be Considered.

The term "cycle" refers to a loop formed by the edges connecting the variable nodes to the check nodes in a factor graph of an LDPC code, and a length of the cycle is defined as the number of edges constituting the loop. A long cycle means that the number of edges connecting the variable nodes to the check nodes constituting the loop in the factor graph of the LDPC code is large. In contrast, a short cycle means that the number of edges connecting the variable nodes to the check nodes constituting the loop in the factor graph of the LDPC code is small.

As cycles in the factor graph of the LDPC code become longer, the performance efficiency of the LDPC code increases. That is, when long cycles are generated in the factor graph of the LDPC code, it is possible to prevent performance degradation such as an error floor occurring when too many cycles with a short length exist in the factor graph of the LDPC code.

(2) Efficient Encoding of an LDPC Code Should be Considered.

It is difficult for the LDPC code to undergo real-time coding, as compared with a convolutional code or a turbo code, because of its high coding complexity. In order to reduce the coding complexity of the LDPC code, a Repeat Accumulate (RA) code has been proposed. However, the RA code also has a limitation in reducing the coding complexity of the LDPC code. Therefore, efficient encoding of the LDPC code should be taken into consideration.

(3) Degree Distribution in a Factor Graph of an LDPC Code Should be Considered.

Generally, an irregular LDPC code is superior in performance to a regular LDPC code, because a factor graph of the irregular LDPC code has various degrees. The term "degree" refers to the number of edges connected to the variable nodes and the check nodes in the factor graph of the LDPC code. Further, the phrase "degree distribution" in a factor graph of an LDPC code refers to a ratio of the number of nodes having a particular degree to the total number of nodes. Additionally, it has been proven by Richardson that an LDPC code having a particular degree distribution is superior in performance.

FIG. 4 is a diagram illustrating a parity check matrix of a general block LDPC code. However, before a description of FIG. 4 is given, it should be noted that the block LDPC code is a new LDPC code that efficient coding and efficient storage and performance improvement of a parity check matrix were considered, and the block LDPC code is an LDPC code extended by generalizing a structure of a regular LDPC code.

Referring to FIG. 4, a parity check matrix of the block LDPC code is divided into a plurality of partial blocks, and a permutation matrix is mapped to each of the partial blocks. In FIG. 4, 'P' represents a permutation matrix having an $N_s \times N_s$ size, and a superscript (or exponent) $a_{pq}$ of the permutation matrix P is either $0 \leq a_{pq} \leq N_s - 1$ or $a_{pq} = \infty$. In addition, 'p' indicates that a corresponding permutation matrix is located in the $p^{th}$ row of the partial blocks of the parity check matrix, and 'q' indicates that a corresponding permutation matrix is located in the $q^{th}$ column of the partial blocks of the parity check matrix. That is, $P^{a_{pq}}$ represents a permutation matrix located in a partial block where the $p^{th}$ row and the $q^{th}$ column of the parity check matrix comprised of a plurality of partial blocks cross each other. More specifically, the 'p' and the 'q' represent the number of rows and the number of columns of partial blocks mapped to an information part in the parity check matrix, respectively.

FIG. 5 is a diagram illustrating the permutation matrix P of FIG. 4. As illustrated in FIG. 5, the permutation matrix P is a square matrix having an $N_s \times N_s$ size, and each of $N_s$ columns included in the permutation matrix P has a weight of 1 and each of $N_s$ rows included in the permutation matrix P also has a weight of 1. Herein, although a size of the permutation matrix P is expressed as $N_s \times N_s$, it will also be expressed as $N_s$ because the permutation matrix P is a square matrix.

In FIG. 4, a permutation matrix P with a superscript $a_{pq} = 0$, i.e., a permutation matrix $P^0$, represents an identity matrix $I_{N_s \times N_s}$, and a permutation matrix P with a superscript $a_{pq} = \infty$, i.e., a permutation matrix $P^\infty$, represents a zero matrix. Herein, $I_{N_s \times N_s}$ represents an identity matrix with a size $N_s \times N_s$.

In the entire parity check matrix of the block LDPC code illustrated in FIG. 4, because the total number of rows is $N_s \times p$ and the total number of columns is $N_s \times q$ (for $p \leq q$), when the entire parity check matrix of the LDPC code has a full rank, a coding rate can be expressed as Equation (1) regardless of a size of the partial blocks.

$$R = \frac{N_s \times q - N_s \times p}{N_s \times q} = \frac{q-p}{q} = 1 - \frac{p}{q} \qquad (1)$$

If $a_{pq} \neq \infty$ for all p and q, the permutation matrices corresponding to the partial blocks are not zero matrices, and the partial blocks constitute a regular LDPC code in which the weight value of each column and the weight value of each row in each of the permutation matrices corresponding to the partial blocks are p and q, respectively. Herein, each of permutation matrices corresponding to the partial blocks will be referred to as a "partial matrix."

Because (p−1) dependent rows exist in the parity check matrix, a coding rate is greater than the coding rate calculated by Equation (1). In the block LDPC code, if a weight position of a first row of each of the partial matrices included in the entire parity check matrix is determined, the weight positions of the remaining ($N_s$−1) rows can be determined. Therefore, the required size of a memory is reduced to $1/N_s$ as compared to when the weights are irregularly selected to store information on the entire parity check matrix.

As described above, the term "cycle" refers to a loop formed by the edges connecting the variable nodes to the check nodes in a factor graph of an LDPC code, and a length of the cycle is defined as the number of edges constituting the loop. A long cycle means that the number of edges connecting the variable nodes to the check nodes constituting the loop in the factor graph of the LDPC code is large. As cycles in the factor graph of the LDPC code become longer, the performance efficiency of the LDPC code increases. In contrast, as cycles in the factor graph of the LDPC code become shorter, an error correction capability of the LDPC code increases because performance degradation such as an error floor occurs. That is, when there are many cycles with a short length in a factor graph of an LDPC code, information on a particular node belonging to the cycle with a short length, starting therefrom, returns after a small number of iterations. As the number of iterations increases, the information returns to the corresponding node more frequently, such that the information cannot be correctly updated, thereby deteriorating an error correction capability of the LDPC code.

FIG. 6 is a diagram illustrating a cycle structure of a block LDPC code of which a parity check matrix includes 4 partial matrices. However, before a description of FIG. 6 is given, it should be noted that the block LDPC code is a new LDPC code that efficient coding, and efficient storage and performance improvement of a parity check matrix were considered. The block LDPC code is also an LDPC code extended by generalizing a structure of a regular LDPC code.

A parity check matrix of the block LDPC code illustrated in FIG. 6 includes 4 partial blocks. A diagonal line represents a position where the elements having a value of 1 are located, and the portions other than the diagonal-lined portions represent positions in which the elements having a value of 0 are located. In addition, 'P' represents the same permutation matrix as the permutation matrix described in conjunction with FIG. 5.

In order to analyze a cycle structure of the block LDPC code illustrated in FIG. 6, an element having a value of 1 located in an $i^{th}$ row of a partial matrix $P^a$ is defined as a reference element, and an element having a value of 1 located in the $i^{th}$ row will be referred to as a "0-point." Herein, "partial matrix" will refer to a matrix corresponding to the partial block. The 0-point is located in an $(i+a)^{th}$ column of the partial matrix pa.

An element having a value of 1 in a partial matrix $P^b$, located in the same row as the 0-point, will be referred to as a "1-point." For the same reason as the 0-point, the 1-point is located in an $(i+b)^{th}$ column of the partial matrix $P^b$.

An element having a value of 1 in a partial matrix $P^c$, located in the same column as the 1-point, will be referred to as a "2-point." Because the partial matrix $P^c$ is a matrix acquired by shifting respective columns of an identity matrix I to the right with respect to a modulo $N_s$ by c, the 2-point is located in an $(i+b−c)^{th}$ row of the partial matrix $P^c$.

In addition, an element having a value of 1 in a partial matrix $P^d$, located in the same row as the 2-point, will be referred to as a "3-point." The 3-point is located in an $(i+b−c+d)^{th}$ column of the partial matrix $P^d$.

An element having a value of 1 in the partial matrix $P^a$, located in the same column as the 3-point, will be referred to as a "4-point." The 4-point is located in an $(i+b−c+d−a)^{th}$ row of the partial matrix $P^a$.

In the cycle structure of the LDPC code illustrated in FIG. 6, if a cycle of length 4 exists, the 0-point and the 4-point are located in the same position. That is, a relation between the 0-point and the 4-point is defined by Equation (2)

$$i \cong i+b-c+d-a \pmod{N_s} \text{ or}$$

$$i+a \cong i+b-c+d \pmod{N_s} \quad (2)$$

Equation (2) can be rewritten as shown in Equation (3)

$$a+c \cong b+d \pmod{N_s} \quad (3)$$

When the relationship of Equation (3) is satisfied, a cycle with a length 4 is generated. Generally, when a 0-point and a 4p-point are first identical to each other, a relation of $i \cong i+p(b−c+d−e) \pmod{N_s}$ is given, and the relation shown in Equation (4) is satisfied.

$$p(a-b+c-d) \cong 0 \pmod{N_s} \quad (4)$$

That is, if a positive integer having a minimum value among the positive integers satisfying Equation (4) for a given a, b, c, and d is defined as 'p', a cycle with a length of 4p becomes a cycle having a minimum length in the cycle structure of the block LDPC code illustrated in FIG. 6.

Accordingly, as described above, for (a−b+c−d)≠0, if gcd ($N_s$, a−b+c−d)=1 is satisfied, then $p=N_s$. Therefore, a cycle with a length of $4N_s$ becomes a cycle with a minimum length.

Herein below, a Richardson-Urbanke technique will be used as a coding technique for the block LDPC code. Because the Richardson-Urbanke technique is used as a coding technique, coding complexity can be minimized as the form of a parity check matrix becomes similar to the form of a full lower triangular matrix.

Figure 7:
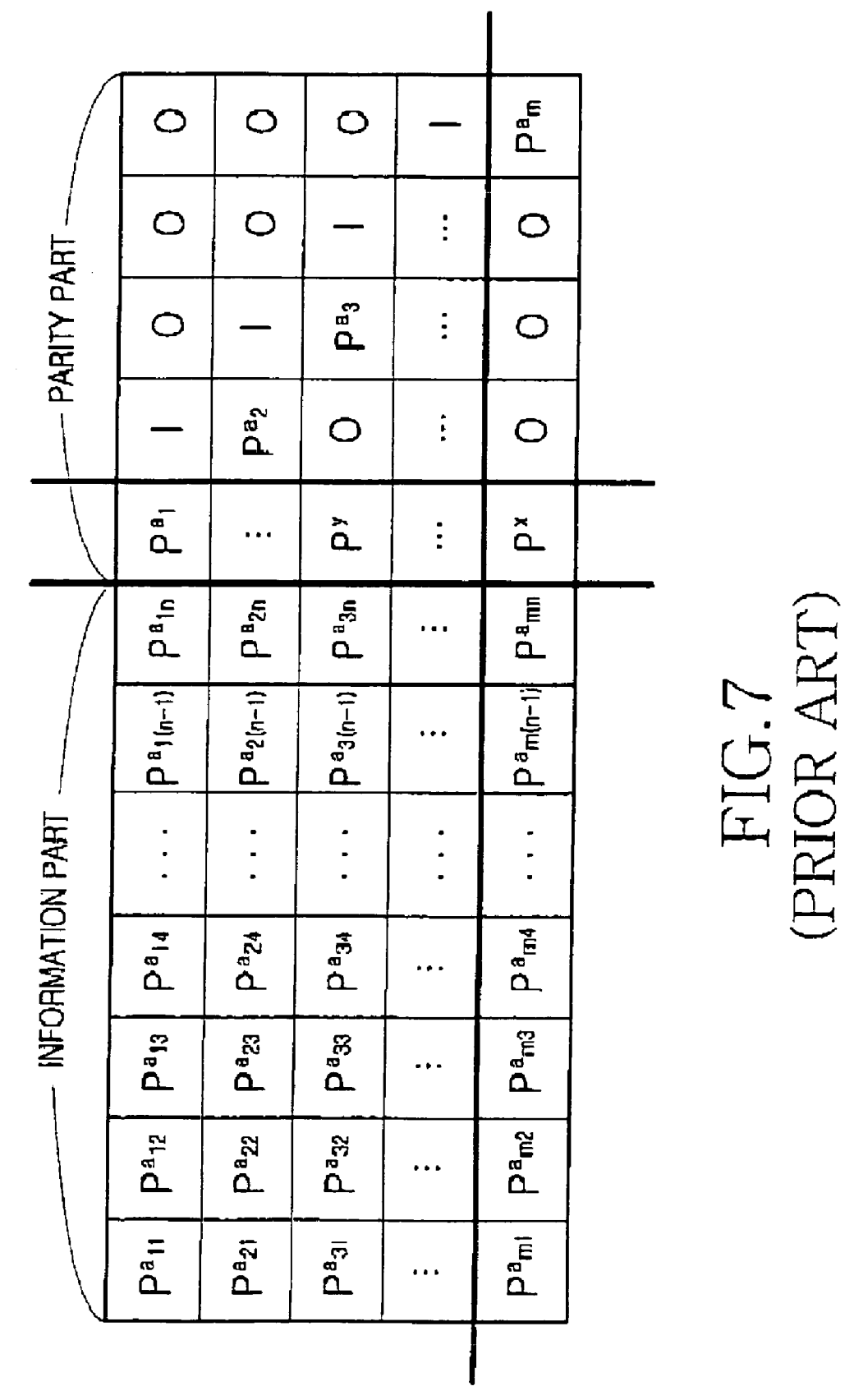

FIG. 7 is a diagram illustrating a parity check matrix having a form similar to that of the full lower triangular matrix. However, the parity check matrix illustrated in FIG. 7 has a different parity part than the parity check matrix having a form of the full lower triangular matrix.

Referring to FIG. 7, a superscript (or exponent) $a_{pq}$ of the permutation matrix P of an information part is either $0 \le a_{pq} \le N_s-1$ or $a_{pq}=\infty$. A permutation matrix P with a superscript $a_{pq}=0$, i.e. a permutation matrix $P^0$, of the information part represents an identity matrix $I_{N_s \times N_s}$, and a permutation matrix P with a superscript $a_{pq}=\infty$, i.e. a permutation matrix $P^\infty$, represents a zero matrix. In addition, 'p' represents the number of rows of partial blocks mapped to the information part in the parity check matrix, and 'q' represents the number of columns of partial blocks mapped to the information part. Also, superscripts $a_p$, x and y of the permutation matrices P mapped to the parity part represent exponents of the permutation matrix P. However, for convenience, the different superscripts $a_p$, x, and y are used to distinguish the parity part from the information part. That is, in FIG. 7, $P^{a_1}$ to $P^{a_p}$ are also permutation matrices, and the superscripts $a_1$ to $a_p$ are sequentially indexed to partial matrices located in a diagonal part of the parity part.

In addition, $P^x$ and $P^y$ are also permutation matrices, and for convenience, they are indexed in a different way to distinguish the parity part from the information part. If a block size of a block LDPC code having the parity check matrix illustrated in FIG. 7 is assumed to be N, the coding complexity of the block LDPC code linearly increases with respect to the block size N (O(N)).

The biggest problem of the LDPC code having the parity check matrix of FIG. 7 is that if a size of a partial block is defined as $N_s$, $N_s$ check nodes whose degrees are always 1 in a factor graph of the block LDPC code are generated. The check nodes with a degree of 1 cannot affect the performance improvement based on the iterative decoding. Therefore, a standard irregular LDPC code based on the Richardson-Urbanke technique does not include a check node with a degree of 1.

Accordingly, a parity check matrix of FIG. 7 will be assumed as a basic parity check matrix in order to design a parity check matrix such that it enables efficient coding while not including a check node with a degree of 1.

In the parity check matrix of FIG. 7 including the partial matrices, the selection of a partial matrix is a very important factor for a performance improvement of the block LDPC code, so that finding an appropriate selection criterion for the partial matrix also becomes a very important factor.

In order to facilitate a method of designing a parity check matrix of the block LDPC code and a method for coding the block LDPC code, the parity check matrix illustrated in FIG. 7 is assumed to be formed with 6 partial matrices as illustrated in FIG. 8.

FIG. 8 is a diagram illustrating the parity check matrix of FIG. 7, which is divided into 6 partial blocks. Referring to FIG. 8, a parity check matrix of the block LDPC code illustrated in FIG. 7 is divided into an information part 's', a first parity part $p_1$, and a second parity part $p_2$. The information part 's' represents a part of the parity check matrix, mapped to an actual information word during the process of coding a block LDPC code, like the information part described in conjunction with FIG. 7, and for convenience, the information part 's' is represented by different reference letters. The first parity part $p_1$ and the second parity part $p_2$ represent a part of the parity check matrix, mapped to an actual parity during the process of coding the block LDPC code, like the parity part described in conjunction with FIG. 7, and the parity part is divided into two parts.

Partial matrices A and C correspond to partial blocks A (802) and C (804) of the information part 's', partial matrices B and D correspond to partial blocks B (806) and D (808) of the first parity part $p_1$, and partial matrices T and E correspond to partial blocks T (810) and E (812) of the second parity part $p_2$. Although the parity check matrix is divided into 7 partial blocks in FIG. 8, it should be noted that because '0' is not a separate partial block and the partial matrix T corresponding to the partial block T (810) have a full lower triangular form, a region where zero matrices are arranged on the basis of a diagonal is represented by '0'. A process of simplifying a coding method using the partial matrices of the information part 's', the first parity part $p_1$ and the second parity part $p_2$ will be described later with reference to FIG. 10.

FIG. 9 is a diagram illustrating a transpose matrix of the partial matrix B illustrated in FIG. 8, the partial matrix E, the partial matrix T, and an inverse matrix of the partial matrix T, in the parity check matrix illustrated in FIG. 7. Referring to FIG. 9, a partial matrix $B^T$ represents a transpose matrix of the partial matrix B, and a partial matrix $T^{-1}$ represents an inverse matrix of the partial matrix T. The $P^{(k_1 \sim k_2)}$ represents $$\prod_{i=k_i}^{k_2} P^{a_i} = P^{\sum_{i=k_i}^{k_2} a_i}.$$

The permutation matrices illustrated in FIG. 9, for example, $P^{a_1}$, may be an identity matrix. As described above, if an exponent of the permutation matrix, i.e. $a_1$ is 0, the permutation matrix $P^{a_1}$ will be an identity matrix. Also, if an exponent of the permutation matrix, i.e., $a_1$ increases by a predetermined value, the permutation matrix is cyclic shifted by the predetermined value, such that the permutation matrix $P^{a_1}$ will be an identity matrix.

FIG. 10 is a flowchart illustrating a procedure for generating a parity check matrix of a general block LDPC code. However, before a description of FIG. 10 is given, it should be noted that in order to generate a block LDPC code, a codeword size and a coding rate of a block LDPC code to be generated must be determined, and a size of a parity check matrix must be determined according to the determined codeword size and coding rate. If a codeword size of the block LDPC code is represented by N and a coding rate is represented by R, a size of a parity check matrix becomes N(1−R)×N.

Actually, the procedure for generating a parity check matrix of a block LDPC code illustrated in FIG. 10 is performed only once, because the parity check matrix is initially generated to be suitable for a situation of a communication system and thereafter, the generated parity check matrix is used.

Referring to FIG. 10, in step 1011, a controller divides a parity check matrix with the size N(1−R)×N into a total of p×q blocks, including p blocks in a horizontal axis and q blocks in a vertical axis. Because each of the blocks has a size of $N_s \times N_s$, the parity check matrix includes $N_s \times p$ rows and $N_s \times q$ columns. In step 1013, the controller classifies the pxq blocks divided from the parity check matrix into an information part 's', a first parity part $p_1$, and a second parity part $p_2$.

In step 1015, the controller separates the information part 's' into non-zero blocks, or non-zero matrices, and zero blocks, or zero matrices according to degree distribution for guaranteeing good performance of the block LDPC code. Because the degree distribution for guaranteeing good performance of the block LDPC code has been described above, a detailed description thereof will omitted herein.

In step 1017, the controller determines the permutation matrices $P^{a_{pq}}$ such that a minimum cycle length of a block cycle should be maximized as described above in the non-zero matrix portions in blocks having a low degree from among the blocks determined according to the degree distribution for guaranteeing a good performance of the block LDPC code. The permutation matrices $p^{a_{pq}}$ should be determined taking into consideration the block cycles of the information part 's', the first parity part $p_1$, and the second parity part $p_2$.

In step 1019, the controller randomly determines the permutation matrices $p^{a_{pq}}$ in the non-zero matrix portions in the blocks having a high degree among the blocks determined according to the degree distribution for guaranteeing a good performance of the block LDPC code, and then ends the procedure. Even when the permutation matrices $p^{is\ pq}$ to be applied to the non-zero matrix portions in the blocks having a high degree are determined, the permutation matrices $p^{a_{pq}}$ must be determined such that a minimum cycle length of a block cycle is maximized. The permutation matrices $p^{a_{pq}}$ are determined taking into account the block cycles of the information part 's', the first parity part $p_1$, and the second parity part $p_2$. An example of the permutation matrices $p^{a_{pq}}$ arranged in the information part 's' of the parity check matrix is illustrated in FIG. 9.

In step 1021, the controller divides the first part $p_1$ and the second parity part $p_2$ into 4 partial matrices B, T, D, and E. In step 1023, the controller inputs the non-zero permutation matrices $P^y$ and $P^{a_1}$ to 2 partial blocks among the partial blocks included in the partial matrix B. The structure for inputting the non-zero permutation matrices $P^y$ and $p^{a_1}$ to 2 partial blocks among the partial blocks constituting the partial matrix B has been described above with reference to FIG. 9.

In step 1025, the controller inputs the identity matrices I to the diagonal partial blocks of the partial matrix T, and inputs the particular permutation matrices $P^{a_2}, P^{a_3}, \ldots, P^{a_{m-1}}$ to $(i, i+1)^{th}$ partial blocks under the diagonal components of the partial matrix T. The structure for inputting the identity matrices I to the diagonal partial blocks of the partial matrix T and inputting the particular permutation matrices $P^{a_2}, P^{a_3}, \ldots, P^{a_{m-1}}$ to $(i, i+1)^{th}$ partial blocks under the diagonal components of the partial matrix T has been described above with reference to FIG. 9.

In step 1027, the controller inputs a permutation matrix $P^y$ to the partial matrix D. In step 1029, the controller inputs a permutation matrix $P^{a_m}$ to only the last partial block in the partial matrix E, and then ends the procedure. The structure for inputting the 2 permutation matrices $P^{a_m}$ to only the last partial block among the partial blocks constituting the partial matrix E has been described above with reference to FIG. 9.

As described above, it is known that the LDPC code, together with the turbo code, has a high performance gain during high-speed data transmission and effectively corrects an error caused by noises generated in a transmission channel, thereby increasing the reliability of data transmission. However, the LDPC code is disadvantageous in terms of the coding rate. That is, because the LDPC code has a relatively high coding rate, it has a limitation in terms of the coding rate. Among the currently available LDPC codes, major LDPC codes have a coding rate of ½ and only minor LDPC codes have a coding rate of ⅓. The limitation in the coding rate exerts a fatal influence on high-speed, high-capacity data transmission.

Although a degree distribution representing the best performance can be calculated using a density evolution scheme in order to implement a relatively low coding rate for the LDPC code, it is difficult to implement an LDPC code having a degree distribution exhibiting the best performance due to various restrictions, such as a cycle structure in a factor graph and hardware implementation.

SUMMARY OF THE INVENTION

It is, therefore, an object of the present invention to provide an apparatus and method for encoding and decoding block Low Density Parity Check (LDPC) codes.

It is another object of the present invention to provide an apparatus and method for encoding and decoding block LDPC codes with minimized coding complexity in a mobile communication system.

According to one aspect of the present invention, there is provided a method for coding a block low density parity check (LDPC) code. The method comprises the steps of receiving an information word vector; and coding the information word vector into the block LDPC code according to a predetermined generation matrix.

According to another aspect of the present invention, there is provided an apparatus for coding a block low density parity check (LDPC) code. The apparatus comprises an encoder for coding an information word vector into a block LDPC code according to a predetermined generation matrix; a modulator for modulating the block LDPC code into a modulation symbol using a predetermined modulation scheme; and a transmitter for transmitting the modulation symbol.

According to further another aspect of the present invention, there is provided a method for decoding a block low density parity check (LDPC) code. The method comprises the steps of: receiving a signal; decoding the received signal using a parity check matrix predetermined according to a length of a block LDPC code to be decoded; and detecting the block LDPC code from the decoded received signal.

According to still another aspect of the present invention, there is provided an apparatus for decoding a block low density parity check (LDPC) code. The apparatus comprises a receiver for receiving a signal; and a decoder for decoding the received signal using a parity check matrix predetermined according to a length of a block LDPC code to be decoded, and detecting the block LDPC code from the decoded received signal.

BRIEF DESCRIPTION OF THE DRAWINGS

The above and other objects, features, and advantages of the present invention will become more apparent from the following detailed description when taken in conjunction with the accompanying drawings in which:

FIG. 4 is a diagram illustrating a parity check matrix of a conventional block LDPC code;

FIG. 5 is a diagram illustrating the permutation matrix P illustrated in FIG. 4;

FIG. 7 is a diagram illustrating a parity check matrix having a form similar to the form of a full lower triangular matrix;

FIG. 9 is a diagram illustrating a transpose matrix of a partial matrix B illustrated in FIG. 8, a partial matrix E, a partial matrix T, and an inverse matrix of the partial matrix T;

FIG. 11 is a diagram illustrating a transpose matrix $B^T$ of a partial matrix B, a partial matrix D, and a partial matrix T among 6 partial matrices divided from a parity check matrix of an irregular block LDPC code according to an embodiment of the present invention;

FIG. 12 is a diagram illustrating a matrix F used for generating a generation matrix H' according to an embodiment of the present invention;

DETAILED DESCRIPTION OF THE PREFERRED EMBODIMENT

Preferred embodiments of the present invention will now be described in detail herein below with reference to the annexed drawings. In the following description, a detailed description of known functions and configurations incorporated herein has been omitted for conciseness.

Figures 1, 2:
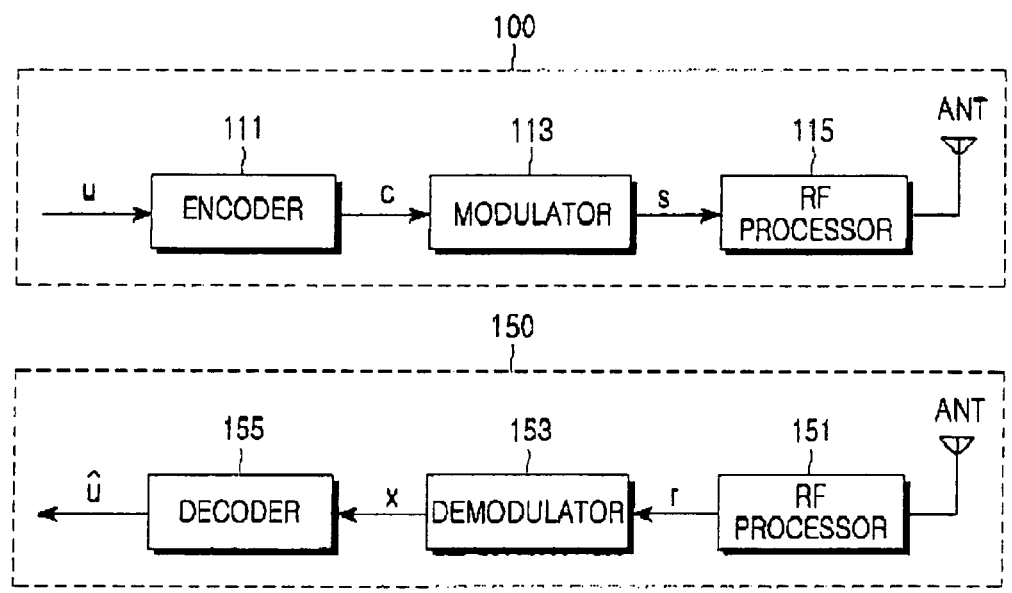
FIG. 1 is a diagram illustrating a transceiver in a conventional mobile communication system.
FIG. 2 is a diagram illustrating a parity check matrix of a conventional (8, 2, 4) LDPC code.
Figure 3:
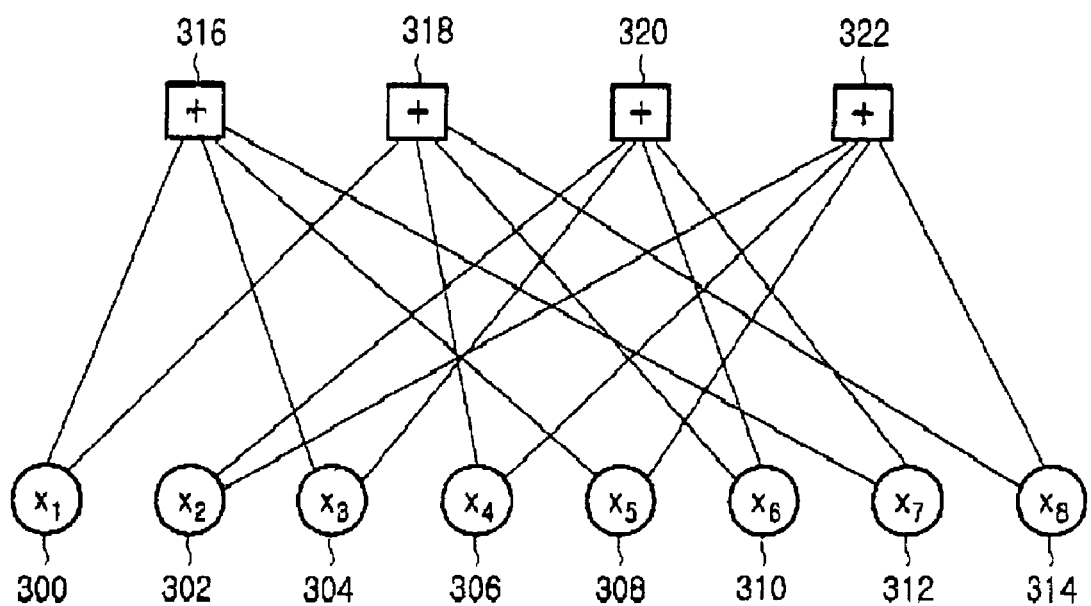
FIG. 3 is a diagram illustrating a factor graph of the (8, 2, 4) LDPC code illustrated in FIG. 2.
Figure 6:
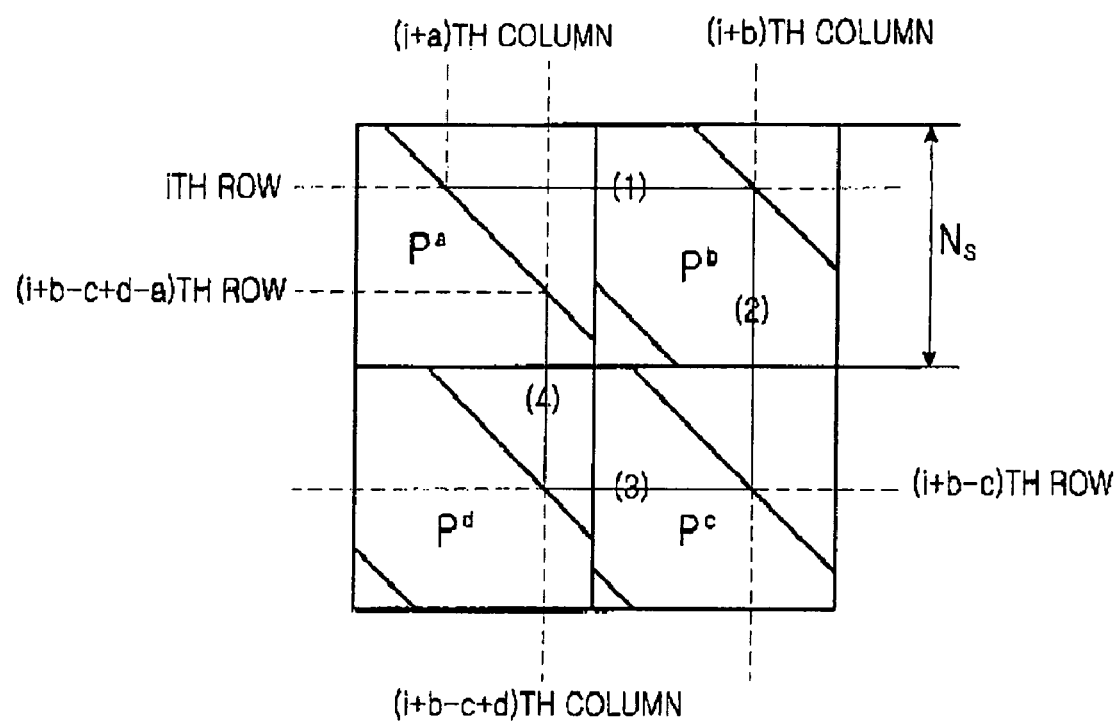
FIG. 6 is a diagram illustrating a cycle structure of a block LDPC code of which a parity check matrix includes 4 partial matrices.

The present invention presents an apparatus and method for encoding and decoding block Low Density Parity Check (LDPC) codes having high performance. That is, the present invention presents an apparatus and method for encoding and decoding block LDPC codes in which a length of a minimum cycle in a factor graph is maximized, coding complexity is minimized, and a degree distribution in the factor graph has the best degree distribution of 1. Although not separately illustrated herein, the apparatus for encoding and decoding block LDPC codes according to the present invention can be applied to the transceiver described with reference to FIG. 1.

FIG. 11 is a diagram illustrating a transpose matrix $B^T$ of a partial matrix B, a partial matrix D, and a partial matrix T, among 6 partial matrices divided from a parity check matrix of a block LDPC code according to an embodiment of the present invention.

Figure 8:
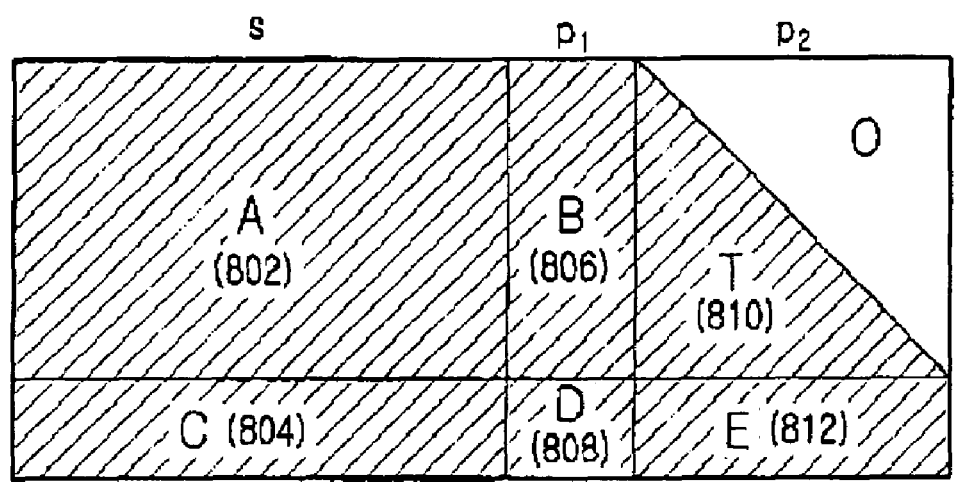
FIG. 8 is a diagram illustrating the parity check matrix illustrated in FIG. 7 that is divided into 6 partial blocks.
Figure 10:
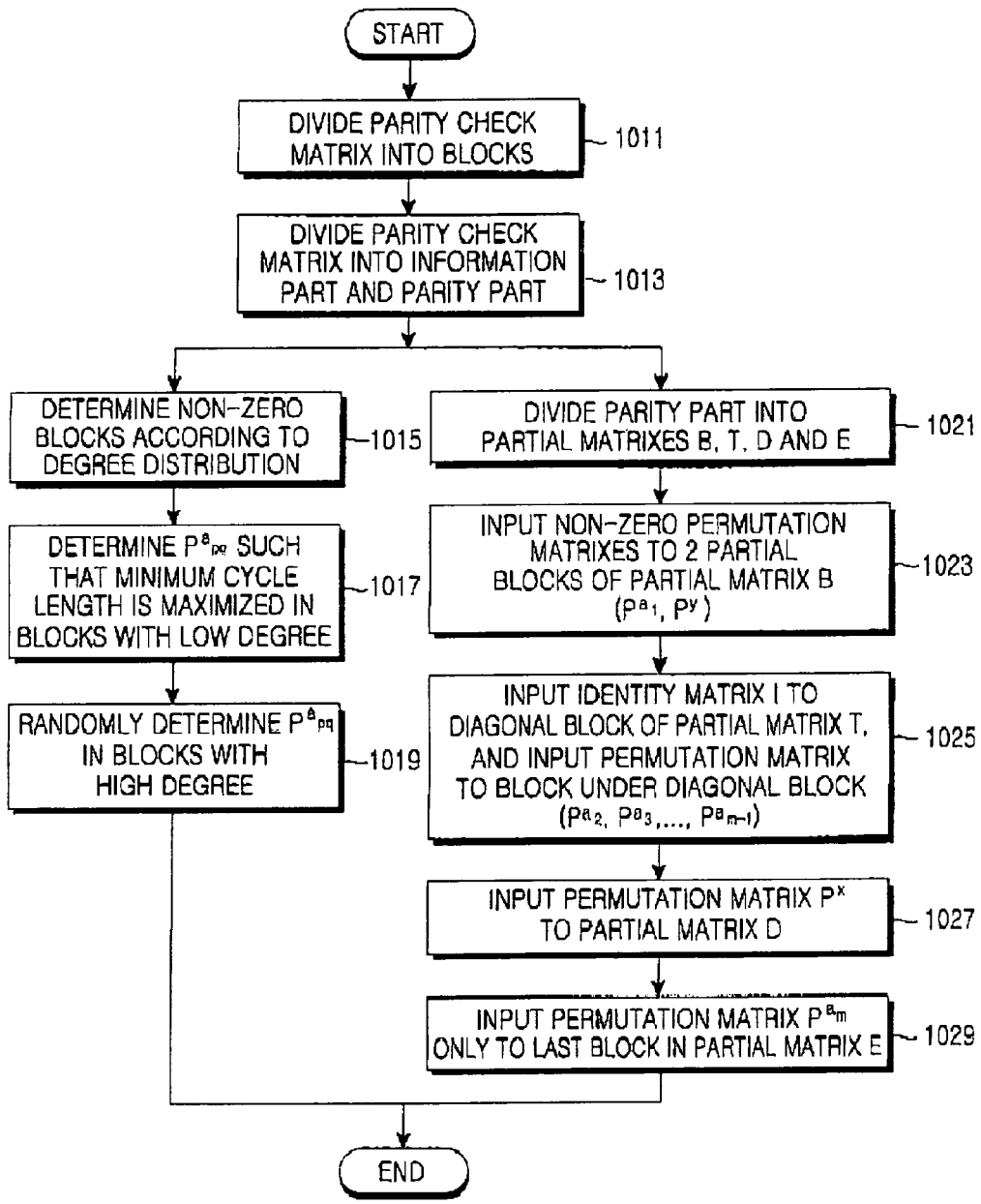
FIG. 10 is a flowchart illustrating a procedure for generating a parity check matrix of a conventional block LDPC code.

Before a description of FIG. 11 is given, it should be noted that the parity check matrix has the partial block structure described in the prior art section with reference to FIG. 8. That is, the parity check matrix of a block LDPC code is divided into partial blocks for an information part 's', a first parity part $p_1$, and a second parity part $p_2$. The information part 's' represents a part of the parity check matrix, mapped to an actual information word during the process of coding the block LDPC code. The first parity part $p_1$ and the second parity part $p_2$ represent parts of the parity check matrix, mapped to an actual parity during the process of coding the block LDPC code.

As illustrated in FIG. 8, the information part 's' is divided into a partial block A and a partial block C, the first parity part $p_1$ is divided into a partial block B and a partial block D, and the second parity part $p_2$ is divided into a partial block T and a partial block E. Partial matrices A and C correspond to the partial blocks A and C, partial matrices B and D correspond to the partial blocks B and D, and partial matrices T and E correspond to the partial blocks T and E.

Referring to FIG. 11, the partial matrix B includes two identical permutation matrices $P^{a_1}$ and zero matrices. The permutation matrix P is a square matrix with a size Ns×Ns, in which a weight of each of $N_s$ rows is 1 and a weight of each of $N_s$ columns is also 1. Although a size of the permutation matrix P has been expressed as $N_s \times N_s$, the size of the permutation matrix P, which is a square matrix, will be expressed as $N_s$, for convenience.

In the foregoing description given with reference to FIG. 9, the partial matrix B includes permutation matrices $P^{a_1}$ and $P^x$, and zero matrices. In the case of the conventional block LDPC code, in order to satisfy $ET^{-1}B+D=I$, the permutation matrices $P^{a_1}$ and $P^x$ other than the zero matrices of the partial matrix B must be fixed in position as illustrated in FIG. 9, and the permutation matrices $P^{a_1}$ and $P^x$ are different from each other. However, in the present invention, the two permutation matrices $P^{a_1}$ other than the zero matrices of the partial matrix B mustn't be fixed in position, and the two permutation matrices $P^{a_1}$ are variable in position and equal to each other. The partial matrix T has identity matrices I in a dual-diagonal structure, and zero matrices. The partial matrix D includes a partial matrix $P^x$.

In FIG. 11, superscripts $a_i$ and x of the permutation matrix P represent exponents of the permutation matrix P.

Although the two permutation matrices $P^{a_1}$ are mapped to the transpose matrix $B^T$ of the partial matrix B and the permutation matrix $P^x$ is mapped to the partial matrix D in FIG. 11 by way of example, the same effect can be obtained if the permutation matrices $P^{a_1}$ are mapped to only two permutation matrices among a total of three permutation matrices being mapped to the transpose matrix $B^T$ of the partial matrix B and the partial matrix D. That is, even though the permutation matrix $P^{a_1}$ is mapped to any one of the two permutation matrices existing in the transpose matrix $B^T$ of the partial matrix B and the permutation matrix $P^{a_1}$ is mapped to the permutation matrix existing in the partial matrix D, the same effect can be obtained.

Alternatively, the same effect can be obtained even though the permutation matrices $P^{a_1}$ are mapped to both of the two permutation matrices existing in the transpose matrix $B^T$ of the partial matrix B and the permutation matrix existing in the partial matrix D.

Additionally, in FIG. 11, the permutation matrix $P^{a_1}$ can be an identity matrix because if an exponent of the permutation matrix is $a_1=0$, the permutation matrix $P^{a_1}$ becomes an identity matrix as described above. In addition, the exponent $a_1$ of the permutation matrix increases by a predetermined value, the permutation matrix is cyclic shifted by the predetermined value, such that the permutation matrix $P^{a_1}$ becomes an identity matrix.

In the case of the conventional block LDPC code, the intact parity check matrix used in the decoder is used as a generation matrix for the encoder. However, in the case of the block LDPC code proposed in the present invention, the parity check matrix used in the decoder is modified before being used as a generation matrix for the encoder, thereby minimizing the coding complexity of the block LDPC code.

The parity check matrix, represented by H, can be expressed as shown in Equation (5).

$$H=[H_1|H_2]=[H_1|H_{21}H_{22}] \qquad (5)$$

In Equation (5), $H_1$ denotes a matrix mapped to an information word, i.e., a matrix mapped to an information part 's', in the parity check matrix H, and an $H_2$ denotes a matrix mapped to a parity, i.e., a matrix mapped to a first parity part $p_1$ and a second parity part $p_2$, in the parity check matrix H. That is, the $H_1$ represents a matrix including a partial matrix A and a partial matrix C, and the $H_2$ represents a matrix including a partial matrix B, a partial matrix T, a partial matrix D, and a partial matrix E. However, because the coding scheme proposed in the present invention is not based on the Richardson-Urbanke technique, the proposed coding scheme is not required to divide the parity check matrix of the block LDPC code into six partial matrices like the Richardson-Urbanke technique. Instead, the proposed scheme divides the parity check matrix into the matrix $H_1$ mapped to the information part, and the matrices $H_{21}$ and $H_{22}$ mapped to the first parity part and the second parity part.

A generation matrix provided by modifying the parity check matrix H, used in an encoder, is represented by H', and the generation matrix H' can be expressed as Equation (6) using a new matrix F.

$$H'=FH=[H_1'|H_2']=[H_1'|H_{21}'H_{22}'] \qquad (6)$$

In Equation (6), F denotes a matrix with a size (N–K)×(N–K), N denotes a block size or a length of a codeword of the code, and K denotes a length of an information word. The matrix F is illustrated in FIG. 12, and will be described later. Like the parity check matrix H described with reference to Equation (5), the generation matrix H' is divided into $H_1'$ mapped to an information word and $H_2'$ mapped to a parity, and the $H_2'$ is divided into $H_{21}'$ mapped to a first parity and $H_{22}'$ mapped to a second parity.

In the generation matrix H' shown in Equation (6), exponents of all of non-zero permutation matrices corresponding to the last block increase by $a_m$ through a modulo-$N_s$ operation, the $H_{22}'$ mapped to the second parity has identity matrices in a dual-diagonal structure per block, and all of the remaining matrices except for the identity matrices include zero matrices.

A description will now be made of a process of coding the block LDPC code using the generation matrix H'.

A codeword vector $\underline{c}$ of the block LDPC code can be divided into an information word vector $\underline{s}$, a first parity vector $\underline{p_1}$, and a second parity vector $\underline{p_2}$. As described above, the first parity vector $\underline{p_1}$ is mapped to the partial blocks B and D, and the second parity vector $\underline{p_2}$ is mapped to the partial blocks T and E.

Coding of the first parity vector $\underline{p_1}$ is achieved using Equation (7) and Equation (8) below. Because $H\underline{c}^T=H'\underline{c}^T=\underline{0}$, a relationship of Equation (7) is satisfied.

$$H'\underline{c}^T = \left(\sum_{block\ rows} H_1'\right)\underline{s}^T + \left(\sum_{block\ rows} H_{21}'\right)\underline{p_1}^T + \left(\sum_{block\ rows} H_{22}'\right)\underline{p_2}^T \quad (7)$$
$$= \underline{0}$$

In Equation (7), $$\sum_{block\ rows} H_1'$$

denotes an $N_s \times K$ matrix provided by summing all of the rows in the $H_1'$ per block. When matrix calculation based on the per-block summation is applied to the parity check matrix described with reference to FIG. 4, the resultant matrix becomes an $N_s \times qN_s$ matrix, and each $N_s \times N_s$ matrix becomes a matrix given by summing all of the permutation matrices corresponding to each block column. For example, a first $N_s \times N_s$ matrix has a value of $$\sum_{i=1}^{P} P^{a_{i1}}$$

in FIG. 4.

Like the $$\sum_{block\ rows} H_1',$$

$$\sum_{block\ rows} H_{21}'$$

denotes an $N_s \times N_s$ matrix provided by summing all of the rows in the $H_{21}'$ per block. Similarly, $$\sum_{block\ rows} H_{22}'$$

denotes an $N_s \times (N-K-N_s)$ matrix provided by summing all of the rows in the $H_{22}'$ per block.

The phrase "summing the rows in a matrix per block" refers to summing rows in the partial blocks included in a corresponding matrix in such a manner that $1^{th}$ rows in the partial blocks are added to each other exclusively. As for calculation of $$\sum_{block\ rows} H_{22}'$$

in Equation (7), because the $H_{22}'$ has a dual-diagonal structure like the partial matrix T illustrated in FIG. 11, a matrix obtained by summing rows per block becomes an $N_s \times (N-K-N_s)$ zero matrix in which all of the elements are 0. Because the $$\sum_{block\ rows} H_{22}'$$

becomes an $N_s \times (N-K-N_s)$ zero matrix, a term $$\left(\sum_{block\ rows} H_{22}'\right)\underline{p_2}^T$$

is removed from Equation (7), Therefore, the matrix $H_{21}'$ can be expressed as Equation (8) according to the characteristic of the partial matrix B described with reference to FIG. 11.

$$\underline{p_1}^{T'} = P^x \underline{p_1}^T = \left(\sum_{block\ rows} H_1'\right)\underline{s}^T \quad (8)$$

In Equation (8), $\underline{p_1}^{T'}$ is a vector obtained by cyclic-shifting $\underline{p_1}^T$ by x, and the $\underline{p_1}^T$ represents a transpose vector of the first parity vector $\underline{p_1}$.

The second parity vector $\underline{p_2}$ can be simply calculated by back substitution because the $H_{22}'$ has a dual-diagonal structure. Because the block LDPC code, unlike the RA code, has a block structure, it can perform the back substitution per block, increasing a calculation speed of the second parity vector $\underline{p_2}$.

More specifically, if it is assumed that the RA code has a parity vector $\underline{p}=(p_1,p_2,\ldots,p_{N-K})$, $p_2$ can be calculated after $p_1$ is determined. Similarly, $p_3$ can be calculated after $p_2$ is determined. Therefore, the (N−K) parity bits must be sequentially calculated.

However, in the process of coding the block LDPC code as proposed in the present invention, because a partial block mapped to a parity of the generation matrix H' has a dual-diagonal structure, $p_1$ through $p_{N_s}$ can be simultaneously calculated, and the next $N_s$ bits can be simultaneously calculated using the $N_s$ bits $P_1$ through $P_{N_s}$ calculated in the previous step. Therefore, the coding process of the block LDPC code proposed in the present invention is $N_s$ times faster than the coding process of the RA code.

Figure 13:
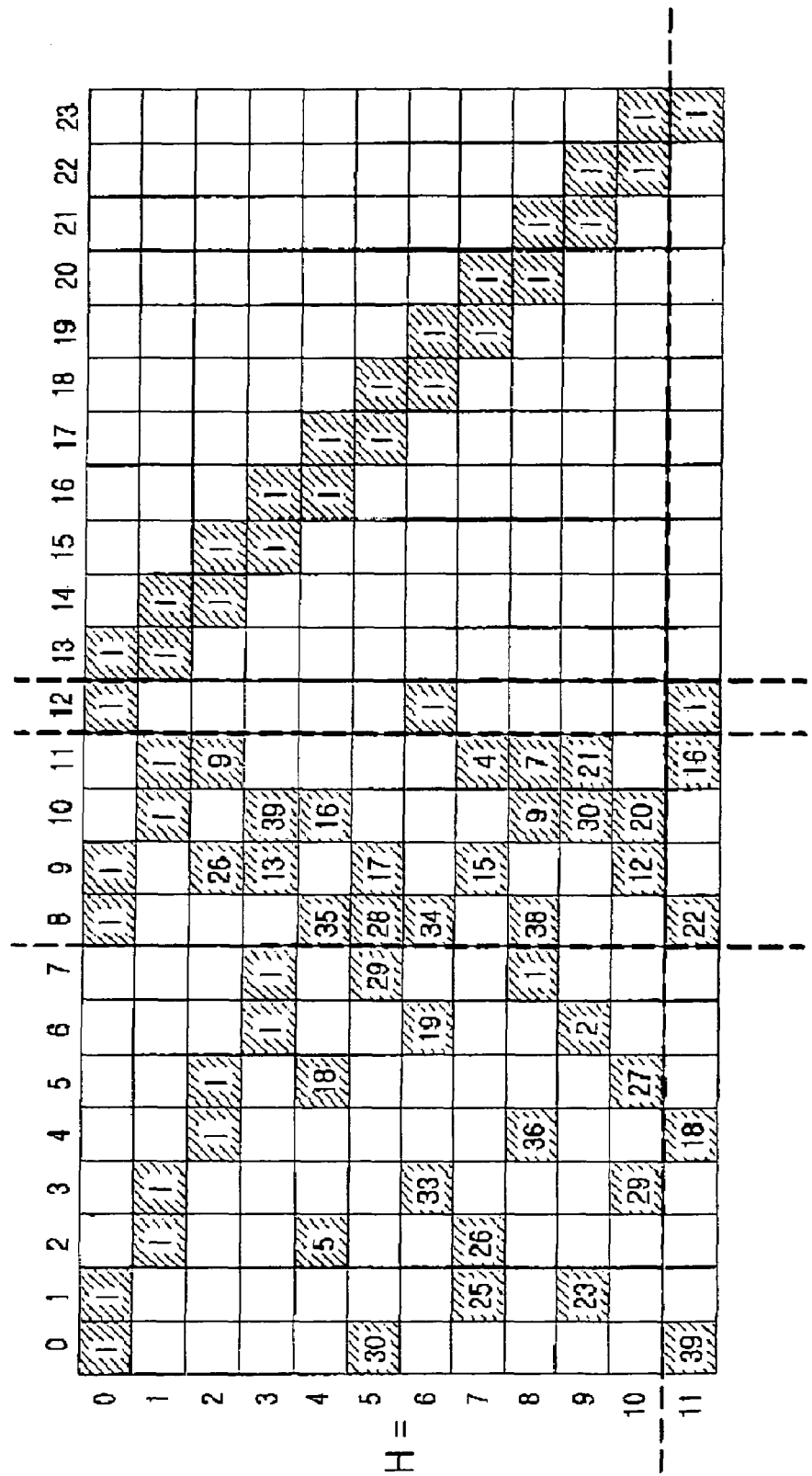
FIG. 13 is a diagram illustrating a parity check matrix of an irregular block LDPC code according to an embodiment of the present invention.

FIG. 13 is a diagram illustrating a parity check matrix of a block LDPC code according to an embodiment of the present invention. The parity check matrix illustrated in FIG. 13 represents a parity check matrix of a block LDPC code with a coding rate of ½, and includes 12×24 blocks.

In FIG. 13, numbers written in blocks represent exponents of permutation matrices located in the corresponding blocks, and 'I' represents identity matrices located in the corresponding blocks. An exponent value of a permutation matrix for the parity check matrix of the block LDPC code with a block size $N_s$ can be calculated by performing a modulo-$N_s$ operation on each of the exponents of the permutation matrices located on the corresponding blocks. If an exponent of a corresponding block is greater than a size $N_s$ of the corresponding block, it means that a modulo-$N_s$ operation should be performed.

Generally, the exponent must be less than $N_s$. However, when the same parity check matrix is commonly used for both a large block size and a small block size, an exponent value greater than the $N_s$ is included in the matrix occasionally. In this case, many parity check matrices are needed according to coding rates and block sizes, increasing required memory capacity. If a value obtained by performing a modulo-$N_s$ operation on an exponent of the permutation matrix is 0, a permutation matrix located in a corresponding block becomes an identity matrix.

Figure 14:
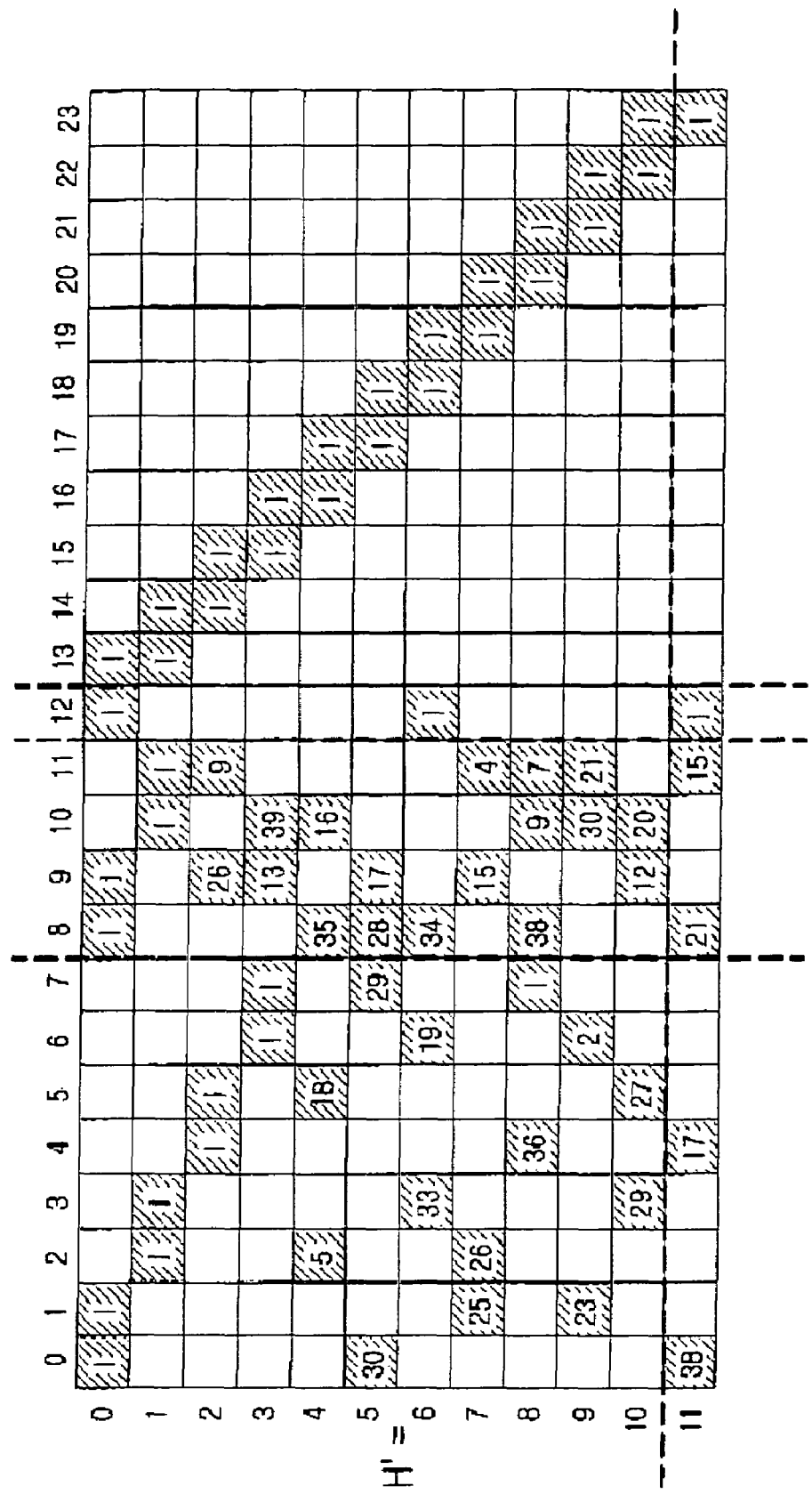
FIG. 14 is a diagram illustrating a generation matrix of an irregular block LDPC code according to an embodiment of the present invention.

FIG. 14 is a diagram illustrating a generation matrix of a block LDPC code according to an embodiment of the present invention. However, before a description of FIG. 14 is given, it should be noted that the generation matrix H' is a matrix generated by multiplying the parity check matrix H by a matrix F as described above. The matrix F will be described with reference to FIG. 12.

FIG. 12 is a diagram illustrating a matrix F used for generating a generation matrix H' according to an embodiment of the present invention. Referring to FIG. 12, in the matrix F, identity matrices I are located along a diagonal line and a permutation matrix $P^{-a_m}$ is located in the last part of the diagonal line. The permutation matrix $P^{-a_m}$ is a permutation matrix having a negative exponent for the permutation matrix $P^{a_m}$ located in the last part of the permutation matrix E of the parity check matrix. It is assumed in FIG. 12 that $a_m=1$.

Referring to FIG. 14, the generation matrix H' is generated by multiplying the parity check matrix H by the matrix F as described above. However, because the permutation matrix $P^{-a_m}$ located in the last part of the matrix F is $P^{-1}$ as described above, the generation matrix H' is compared with the parity check matrix H and only the matrices located in the last block row of the generation matrix H' have exponent values less by 1 than those of the permutation matrix H.

Figure 15:
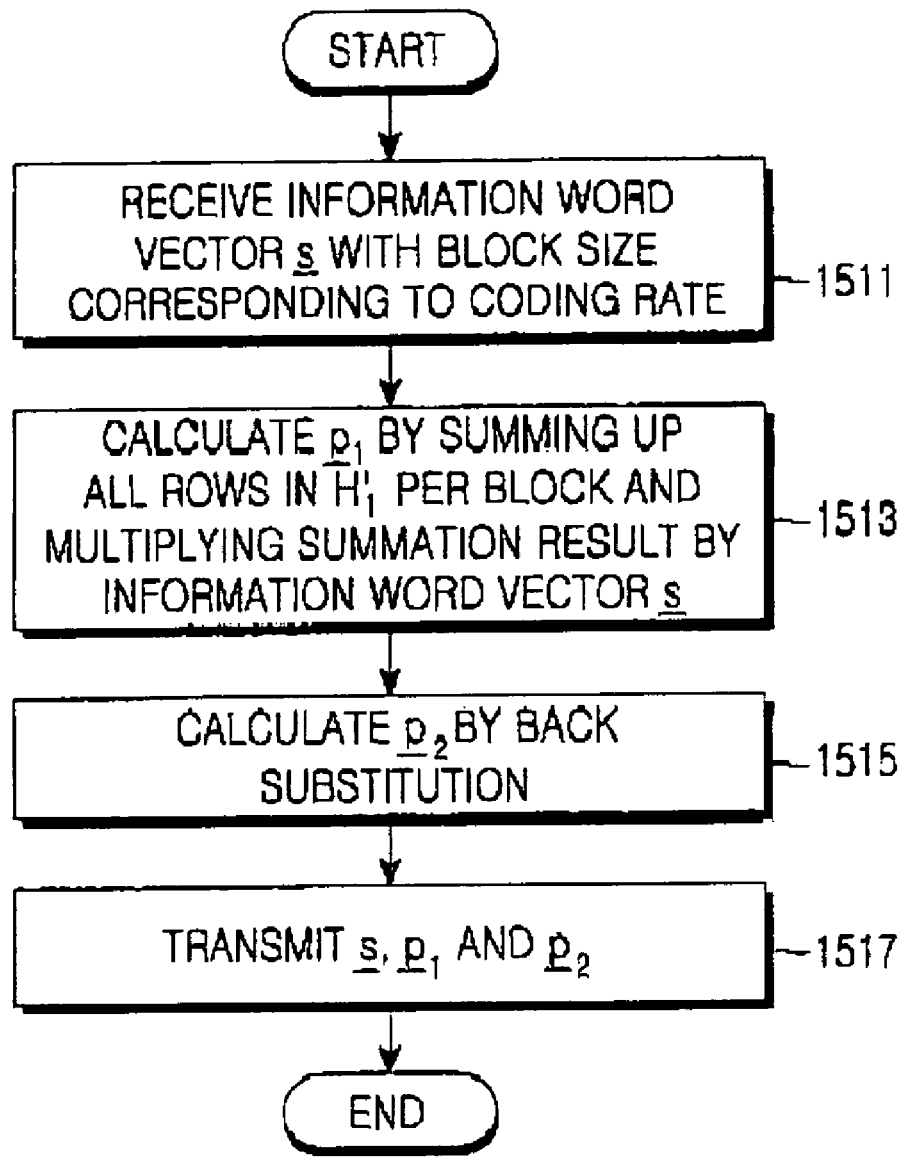
FIG. 15 is a flowchart illustrating a process of coding an irregular block LDPC code according to an embodiment of the present invention.

FIG. 15 is a flowchart illustrating a process of coding a block LDPC code according to an embodiment of the present invention. Referring to FIG. 15, in step 1511, a controller receives an information word vector s to be coded into the block LDPC code. It is assumed herein that the information word vector s has a size corresponding to a coding rate for coding into the block LDPC code, and the size of the information word vector s is k.

In step 1513, the controller calculates a first parity vector $\underline{p}_1$ using a matrix generated by summing all of the rows in an $H_1'$ of the generation matrix H' per block and a transpose vector of the received information word vector s. The matrix generated by summing all of the rows in the $H_1'$ of the generation matrix H' has a size of $N_s \times K$, and the first parity vector $\underline{p}_1$ is calculated using Equation (8).

In step 1515, the controller calculates a second parity vector $\underline{p}_2$ by back substitution using the information word vector s and the first parity vector $\underline{p}_1$. In step 1517, the controller generates a codeword vector c using the information word vector s, the first parity vector $\underline{p}_1$ and the second parity vector $\underline{p}_2$, and transmits the generated codeword vector c.

Figure 16:
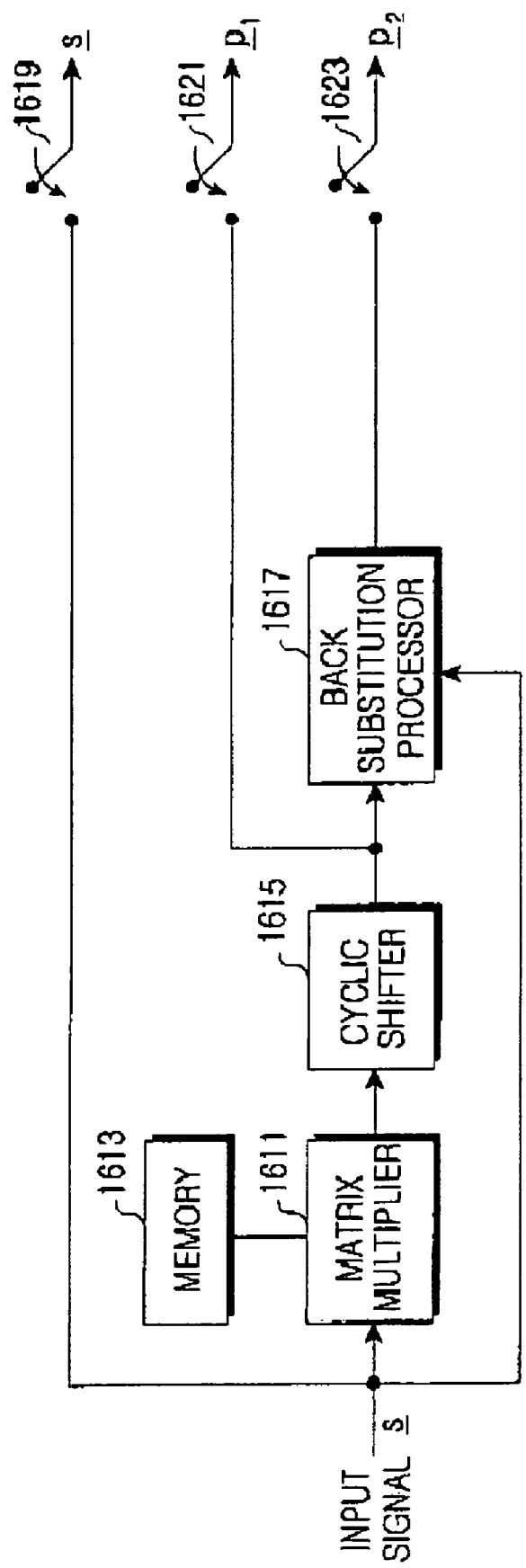
FIG. 16 is a block diagram illustrating an internal structure of a coding apparatus for an irregular block LDPC code according to an embodiment of the present invention.

FIG. 16 is a block diagram illustrating an internal structure of an apparatus for coding a block LDPC code according to an embodiment of the present invention. Referring to FIG. 16, the apparatus for coding a block LDPC code includes a matrix multiplier 1611, a memory 1613, a cyclic shifter 1615, a back substitution processor 1617, and switches 1619, 1621, and 1623.

An input signal, i.e., a length-k information word vector s to be coded into a block LDPC code, is applied to the switch 1619, the matrix multiplier 1611, and the back substitution processor 1617. The matrix multiplier 1611 multiplies the information word vector s by an $N_s \times K$ matrix generated by summing all of the rows in an $H_1'$ of a generation matrix H', stored in the memory 1613, per block, and outputs the result to the cyclic shifter 1615. The signal output from the matrix multiplier 1611 is a vector $\underline{p}_1^{T_1}$ obtained by cyclic-shifting a transpose vector $\underline{p}_1^T$ of a first parity vector $\underline{p}_1$ by x.

The cyclic shifter 1615 calculates a transpose vector $\underline{p}_1^T$ of the first parity vector $\underline{p}_1$ by inversely cyclic-shifting the signal output from the matrix multiplier 1611 by the x, calculates the first parity vector $\underline{p}_1$ using the transpose vector $\underline{p}_1^T$ of the first parity vector $\underline{p}_1$, and outputs the result to the back substitution processor 1617 and the switch 1621. The back substitution processor 1617 calculates a second parity vector $\underline{p}_2$ by back substitution using the information word vector s and the first parity vector $\underline{p}_1$ output from the cyclic shifter 1615, and outputs the result to the switch 1623.

Each of the switches 1619, 1621, and 1623 is switched on only at its transmission time to transmit its associated signal. That is, the switch 1619 is switched on at a transmission time of the information word vector s, the switch 1621 is switched on at a transmission time of the first parity part vector $\underline{P}_1$, and the switch 1623 is switched on at a transmission time of the second parity part vector $\underline{P}_2$.

All of the LDPC-family codes can be decoded in a factor graph using a sub-product algorithm. A decoding scheme of the LDPC code can be roughly divided into a bidirectional transfer scheme and a flow transfer scheme. When a decoding operation is performed using the bidirectional transfer scheme, each check node has a node processor, thereby increasing decoding complexity in proportion to the number of the check nodes. However, because all of the check nodes are simultaneously updated, the decoding speed increases dramatically.

Unlike this, the flow transfer scheme has a single node processor, and the node processor updates information, passing through all of the nodes in a factor graph. Therefore, the flow transfer scheme is lower in decoding complexity, but an increase in size of the parity check matrix, i.e., an increase in number of nodes, causes a decrease in the decoding speed. However, if a parity check matrix is generated per block like the block LDPC code proposed in the present invention, then a number of node processors equal to the number of blocks constituting the parity check matrix are used during decoding. In this case, it is possible to implement a decoder that is lower than the bidirectional transfer scheme in the decoding complexity and higher than the flow transfer scheme in the decoding speed.

Figure 17:
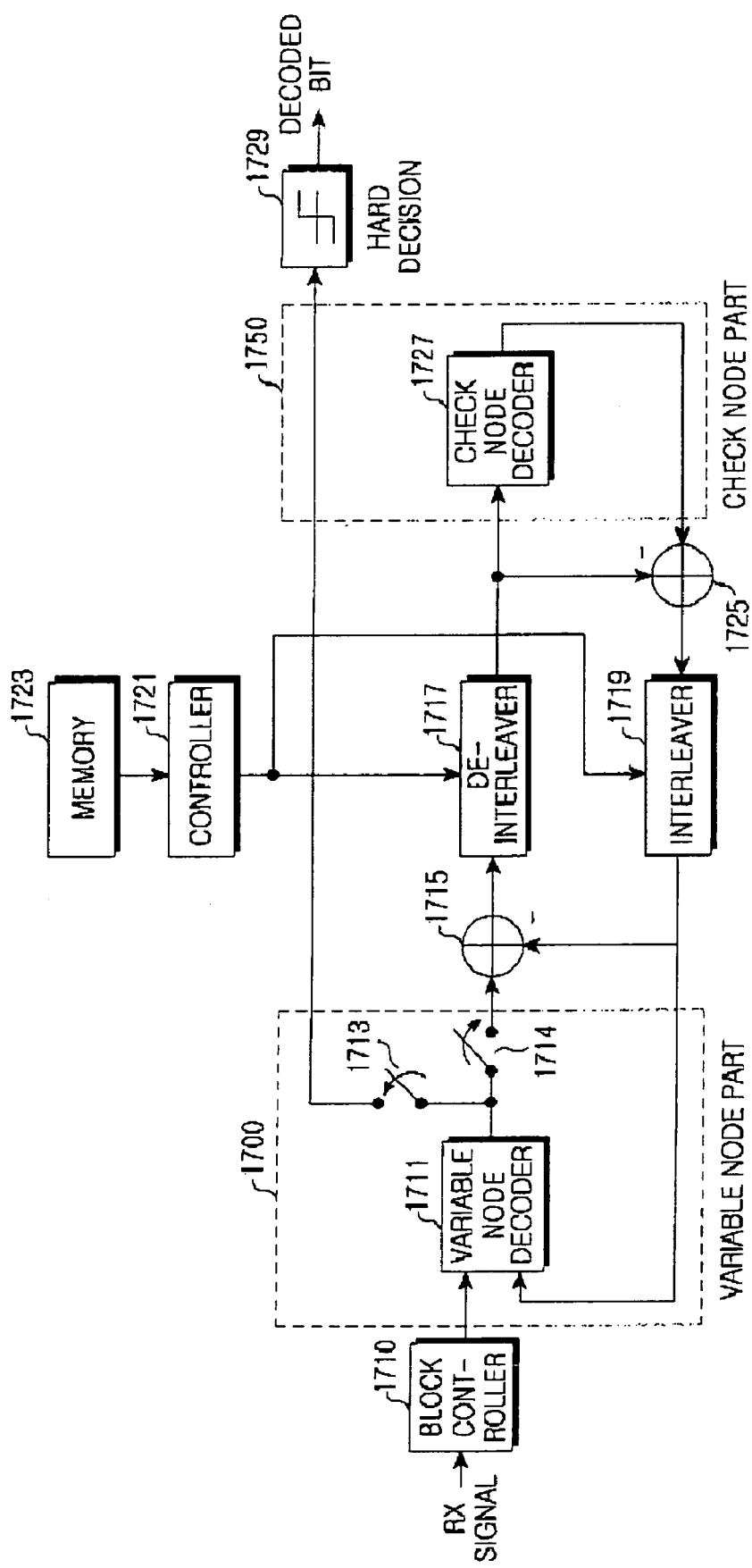
FIG. 17 is a block diagram illustrating an internal structure of a decoding apparatus for an irregular block LDPC code according to an embodiment of the present invention.

FIG. 17 is a block diagram illustrating an internal structure of a decoding apparatus for a block LDPC code according to an embodiment of the present invention. Referring to FIG. 17, the decoding apparatus for a block LDPC code includes a block controller 1710, a variable node part 1700, an adder 1715, a deinterleaver 1717, an interleaver 1719, a controller 1721, a memory 1723, an adder 1725, a check node part 1750, and a hard decider 1729. The variable node part 1700 includes a variable node decoder 1711 and switches 1713 and 1714, and the check node part 1750 includes a check node decoder 1727.

A signal received over a radio channel is input to the block controller 1710. The block controller 1710 determines a block size of the received signal. If there is an information word part punctured in a encoding apparatus corresponding to the decoding apparatus, the block controller 1710 inserts '0' into the punctured information word part to adjust the full block size, and outputs the resultant signal to the variable node decoder 1711. The variable node decoder 1711 calculates probability values of the signal output from the block controller 1710, updates the calculated probability values, and outputs the updated probability values to the switches 1713 and 1714. The variable node decoder 1711 connects the variable nodes according to a parity check matrix previously set in the decoding apparatus for the block LDPC code, and performs an update operation on as many input values and output values as the number of 1s connected to the variable nodes. The number of 1s connected to the variable nodes is equal to a weight of each of the columns constituting the parity check matrix. An internal operation of the variable node decoder 1711 differs according to a weight of each of the columns constituting the parity check matrix. Except when the switch 1713 is switched on, the switch 1714 is switched on to output the output signal of the variable node decoder 1711 to the adder 1715.

The adder 1715 receives a signal output from the variable node decoder 1711 and an output signal of the interleaver 1719 in a previous iterative decoding process, subtracts the output signal of the interleaver 1719 in the previous iterative decoding process from the output signal of the variable node decoder 1711, and outputs the subtraction result to the deinterleaver 1717. If the decoding process is an initial decoding process, it should be regarded that the output signal of the interleaver 1719 is 0.

The deinterleaver 1717 deinterleaves the signal output from the adder 1715 according to a predetermined interleaving scheme, and outputs the deinterleaved signal to the adder 1725 and the check node decoder 1727. The deinterleaver 1717 has an internal structure corresponding to the parity check matrix because an output value for an input value of the interleaver 1719 corresponding to the deinterleaver 1717 is different according to a position of elements having a value of 1 in the parity check matrix.

The adder 1725 receives an output signal of the check node decoder 1727 in a previous iterative decoding process and an output signal of the deinterleaver 1717, subtracts the output signal of the deinterleaver 1717 from the output signal of the check node decoder 1727 in the previous iterative decoding process, and outputs the subtraction result to the interleaver 1719. The check node decoder 1727 connects the check nodes according to a parity check matrix previously set in the decoding apparatus for the block LDPC code, and performs an update operation on as many input values and output values as the number of 1s connected to the check nodes. The number of 1s connected to the check nodes is equal to a weight of each of rows included in the parity check matrix. Therefore, an internal operation of the check node decoder 1727 is different according to a weight of each of the rows constituting the parity check matrix.

The interleaver 1719, under the control of the controller 1721, interleaves the signal output from the adder 1725 according to a predetermined interleaving scheme, and outputs the interleaved signal to the adder 1715 and the variable node decoder 1711. The controller 1721 reads interleaving-related information stored in the memory 1723, and controls an interleaving scheme of the interleaver 1719 according to the read information. Similarly, if the decoding process is an initial decoding process, it should be regarded that the output signal of the deinterleaver 1717 is 0.

By iteratively performing the foregoing processes, the decoding apparatus performs error-free reliable decoding.

After the iterative decoding is performed a predetermined number of times, the switch 1714 switches off a connection between the variable node decoder 1711 and the adder 1715, and the switches 1713 switches on a connection between the variable node decoder 1711 and the hard decider 1729 to provide the signal output from the variable node decoder 1711 to the hard decider 1729. The hard decider 1729 performs a hard decision on the signal output from the variable node decoder 1711, and outputs the hard decision result, and the output value of the hard decider 1729 becomes a finally decoded value.

As can be appreciated from the foregoing description, the present invention proposes a block LDPC code of which a minimum cycle length is maximized in a mobile communication system, thereby maximizing an error correction capability. Therefore, the decoding apparatus can correctly decode received data using the block LDPC code, securing reliable decoding.

In addition, the present invention generates an efficient generation matrix using a parity check matrix, thereby minimizing coding complexity of a block LDPC code.

That is, the present invention proposes a block LDPC code to thereby secure high performance by applying iterative decoding in a factor graph.

In addition, the present invention creates a parity check matrix of a block LDPC code block by block, thereby enabling implementation of a decoder with minimum decoding complexity, improved in terms of the decoding speed. In particular, the present invention minimizes coding complexity using simple matrix multiplication and per-block back substation.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. A method for generating a block low density parity check (LDPC) code, comprising the steps of:

receiving an information word vector; and generating a first parity vector such that a vector generated by multiplying a matrix generated by summing all rows of a fourth matrix for generating a first matrix included in a generation matrix, per block by a transpose vector of the information word vector as a vector generated by cyclic-shifting a transpose vector of the first parity vector by a predetermined value, the first matrix is generated by multiplying the fourth matrix, mapped to the information word vector of a parity check matrix corresponding to a length to be applied when generating the information word vector into a block LDPC code, by a predetermined fifth matrix;

generating a second parity vector using back substitution by a third matrix mapped to the second parity vector in the generation matrix, the third matrix has a dual-diagonal structure, the third matrix is generated by multiplying a seventh matrix mapped to the second parity vector of the parity check matrix by the fifth matrix; and generating the block LDPC code by connecting the first parity vector and the second parity vector to the information word vector;

wherein the generation matrix is generated by modifying the parity check matrix corresponding to the length to be applied when generating the information word vector into the block LDPC code, wherein the generation matrix represents a multiplication of a new matrix F and the parity check matrix, exponents of all non-zero permutation matrices corresponding to a last block of the generation matrix increased by $a_m$ through a modulo-$N_s$ operation, $N_s$ is the number of rows or columns of a permutation matrix corresponding to each of partial blocks constituting the generation matrix, identity matrices are located along a diagonal line of the generation matrix except for a last part, and $a_m$ are exponents of a permutation matrix located in the last part of a diagonal line in the generation matrix, and wherein the generation matrix includes a second matrix mapped to the first parity vector, the second matrix is generated by multiplying a sixth matrix mapped to the first parity vector of the parity check matrix by the fifth matrix.

2. The method of claim 1, wherein the matrix generated by summing all of rows of the fourth matrix per block is generated by summing same rows of partial blocks included in the fourth matrix.

3. The method of claim 1, wherein the first parity vector is generated using:

$$\underline{p_1^{T\prime}} = P^x \underline{p_1^T} = \left( \sum_{block\ rows} H_1' \right) \underline{s^T}$$

where s denotes the information word vector, $\underline{P_1}$ denotes the first parity vector, $\underline{s^T}$ denotes a transpose vector of the information word vector, $\underline{P_1^T}$ denotes a transpose vector of the first parity vector, $P^x$ denotes a matrix generated by cyclic-shifting a permutation matrix with a size $N_s \times N_s$ by x, $\underline{P_1^{T_1}}$ denotes a vector generated by cyclic-shifting the $\underline{P_1^T}$ by x, $$\sum_{block\ rows}$$

denotes an operation of summing all of rows of a corresponding matrix per block, $H_1'$ denotes a matrix, mapped to the information word vector, in which is included the generation matrix, and x denotes exponent of a permutation matrix.

4. The method of claim 3, wherein the operation of summing all of the rows of a corresponding matrix per block sums same rows of partial blocks included in the corresponding matrix.

5. The method of claim 1, wherein the generation matrix is expressed as where numbers written in blocks represent exponents of permutation matrices located in the corresponding blocks, and I represents identity matrices located in the corresponding blocks.

* * * * *

UNITED STATES PATENT AND TRADEMARK OFFICE
CERTIFICATE OF CORRECTION

| | |
|---|---|
| PATENT NO. | : 7,600,174 B2 |
| APPLICATION NO. | : 11/201663 |
| DATED | : October 6, 2009 |
| INVENTOR(S) | : Kyung et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 815 days.

Signed and Sealed this

Fourteenth Day of December, 2010

David J. Kappos
*Director of the United States Patent and Trademark Office*